(12) United States Patent
Rice

(10) Patent No.: US 7,049,614 B2
(45) Date of Patent: May 23, 2006

(54) ELECTRODE IN A DISCHARGE PRODUCED PLASMA EXTREME ULTRAVIOLET SOURCE

(75) Inventor: Bryan J. Rice, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 265 days.

(21) Appl. No.: 10/386,140

(22) Filed: Mar. 10, 2003

(65) Prior Publication Data

US 2004/0178365 A1 Sep. 16, 2004

(51) Int. Cl.
G01J 1/00 (2006.01)
G21G 4/00 (2006.01)

(52) U.S. Cl. .................. 250/504 R; 250/493.1
(58) Field of Classification Search ............. 250/504 R, 250/493.1
See application file for complete search history.

(56) References Cited

U.S. PATENT DOCUMENTS

| | | | | | |
|---|---|---|---|---|---|
| 4,034,031 A | * | 7/1977 | Lersmacher et al. | ........ | 264/400 |
| 4,708,478 A | * | 11/1987 | Andrews et al. | ............ | 356/244 |
| 5,225,735 A | * | 7/1993 | Tardy | ........................ | 313/350 |
| 5,544,618 A | * | 8/1996 | Stall et al. | ................... | 117/102 |
| 5,580,670 A | * | 12/1996 | Grill et al. | ................... | 428/666 |
| 6,019,165 A | * | 2/2000 | Batchelder | ................. | 165/80.3 |
| 6,031,241 A | * | 2/2000 | Silfvast et al. | .......... | 250/504 R |
| 6,356,618 B1 | * | 3/2002 | Fornaciari et al. | ......... | 378/119 |
| 6,452,199 B1 | * | 9/2002 | Partlo et al. | ............ | 250/504 R |
| 6,563,907 B1 | * | 5/2003 | Kubiak et al. | .............. | 378/119 |

* cited by examiner

Primary Examiner—John R. Lee
Assistant Examiner—Kalimah Fernandez
(74) Attorney, Agent, or Firm—Fish & Richardson P.C.

(57) ABSTRACT

An electrode in an extreme ultraviolet (EUV) source of an EUV lithography tool. The extreme ultraviolet source may be operable to produce a plasma which emits extreme ultraviolet radiation.

24 Claims, 6 Drawing Sheets

ELECTRODE IN A DISCHARGE PRODUCED PLASMA EXTREME ULTRAVIOLET SOURCE

BACKGROUND

A microchip manufacturing process may deposit various material layers on a wafer and form a photosensitive film or photoresist on the deposited layers. The process may use lithography to transmit light through transmissive optics or reflect light from reflective optics to a reticle or patterned mask. The reticle transfers a patterned image onto the photoresist. The process may remove portions of the photoresist which are exposed to light. The process may etch portions of the wafer which are not protected by the remaining photoresist. Some of these actions may be repeated.

DETAILED DESCRIPTION

The application relates to an electrode, and methods of making the electrode, which may be used in an extreme ultraviolet (EUV) radiation source of a lithography tool. "Extreme" ultraviolet may refer to radiation with wavelengths of about 13–14 nm.

EUV Lithography Tool

An Extreme Ultraviolet (EUV) lithography tool may be used to print a pattern on a photoresist with dimensions which are smaller than dimensions achieved by other lithography tools.

Figure 1:
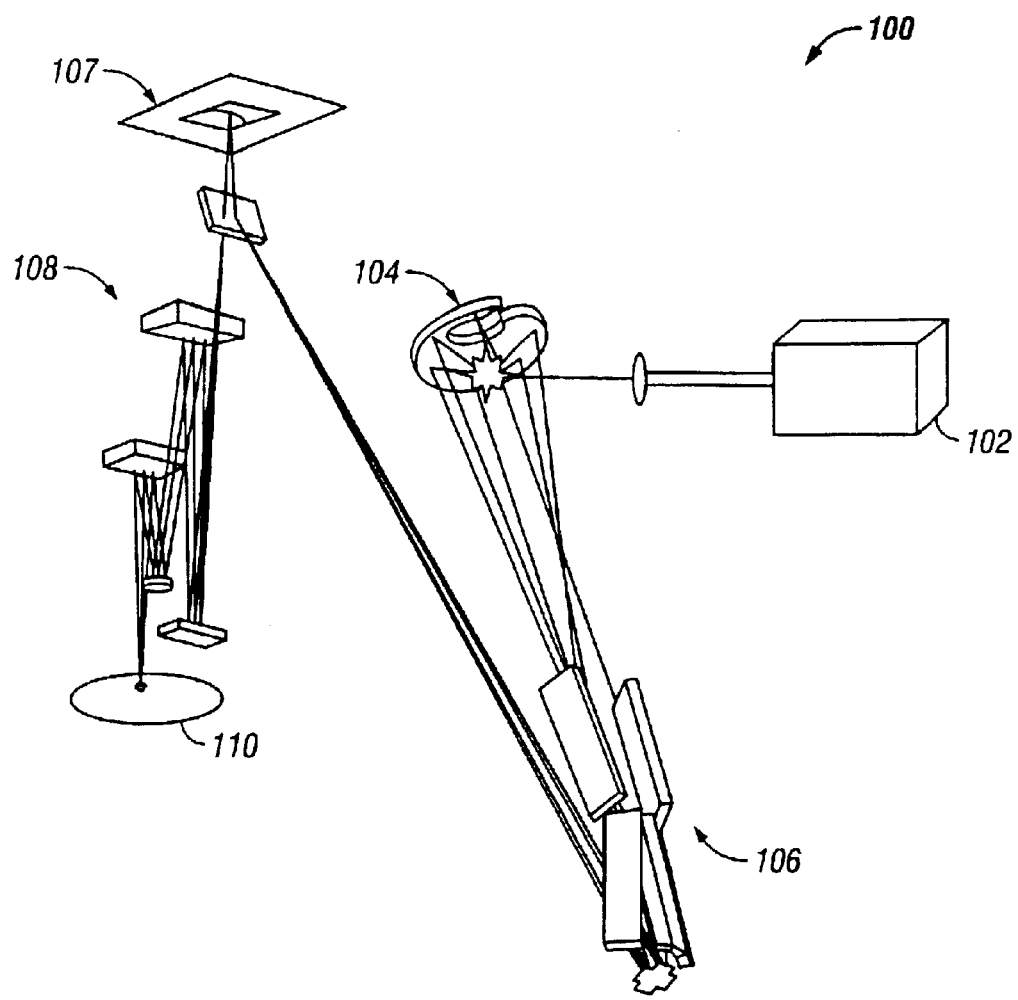
FIG. 1 illustrates one embodiment of an Extreme Ultraviolet (EUV) lithography tool.

FIG. 1 illustrates one embodiment of an Extreme Ultraviolet (EUV) lithography tool 100, which may also be called a "lithographic exposure system" or an "EUV scanner." The lithography tool 100 may include a laser 102, an electric discharge or laser produced plasma source 104, a plurality of condenser optics 106, a reflective reticle 107 with a pattern, and a plurality of reflective reduction optics 108.

The condenser optics 106 collects, shapes and/or focuses the EUV radiation into a narrow arc (or ring shape) to illuminate a scanning reflective reticle 107 (mask) with a patterned image. The EUV radiation reflects off the reticle 107 with the patterned image and may pass through reflective reduction optics 108 (e.g., 4× smaller). In a configuration, the reduction optics 108 include mirrors coated with quarter-wave Bragg reflectors. The image is then reproduced on a scanning wafer 110 coated with a thin layer of photoresist. The EUV lithography tool 100 may use step or scan printing.

The EUV lithography tool 100 may create plasma by using an electric discharge plasma source or a laser-produced plasma (LPP) source 104. If an LPP source is used, the EUV lithography tool 100 focuses a laser 102 onto a gas, liquid, or filament jet of a material or materials, such as Xenon, to produce a plasma.

If an electric discharge plasma source is used, the EUV lithography tool 100 pulses current discharge (kAs), like a powerful arc welder, across electrodes that are separated by a region filled with gas. This process produces a plasma, as explained further with FIGS. 2A–3 below. Excitation of the gas molecules causes the electrons to produce EUV photon radiation. The plasma emits visible and EUV radiation.

The source 104 may produce radiation (photons) with a very short wavelength, such as about 13 nanometers. In other embodiments, the photons may have other suitable wavelengths. Most materials may absorb the short-wavelength photons.

It may be desirable for the EUV lithography tool 100 to deliver about 50–120 watts of "clean" power to projection optics for a throughput of 80 wafers per hour.

Dense Plasma Focus Electric Discharge Source

Figure 2A:
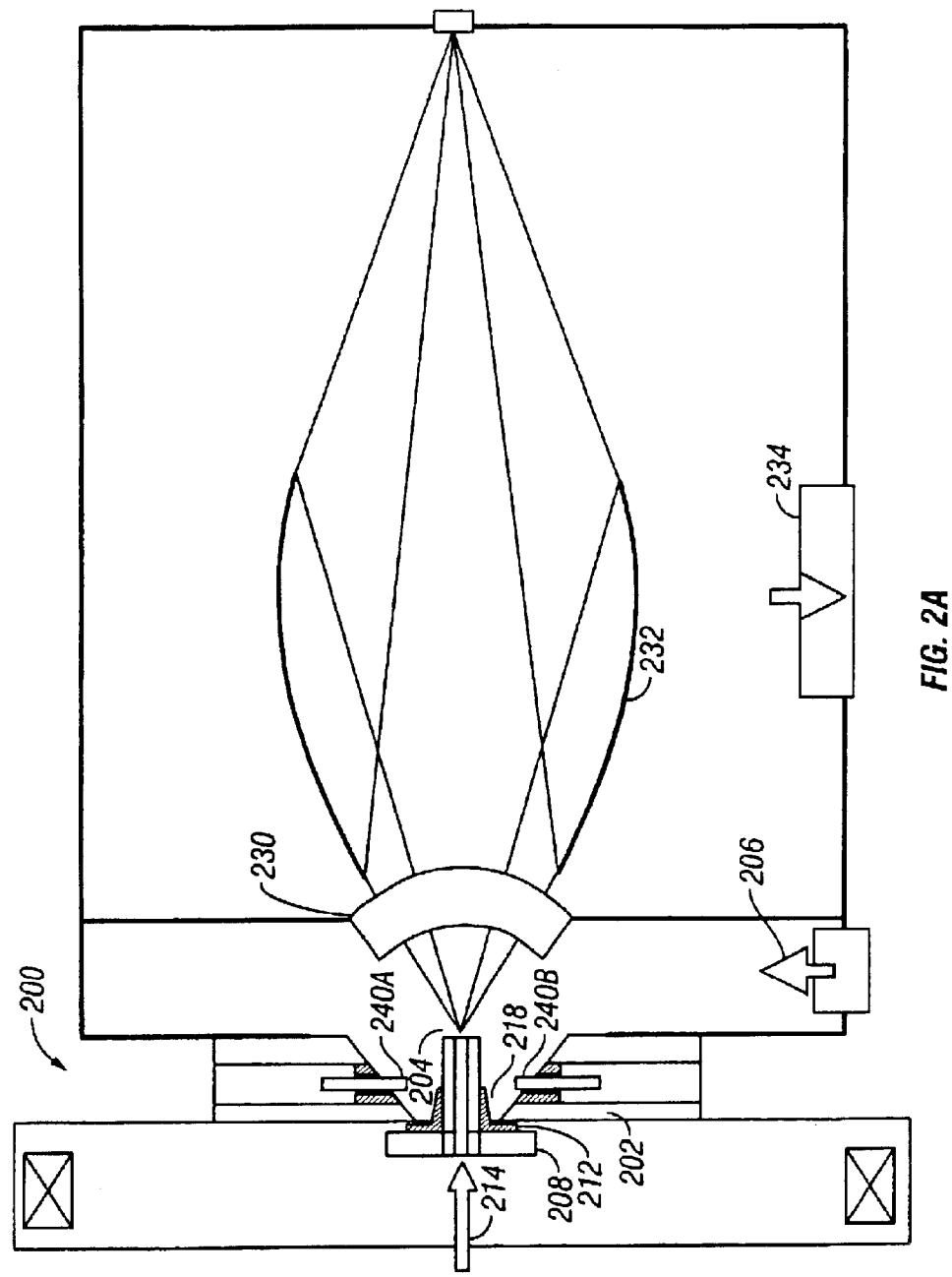
FIGS. 2A–2B are cross-sectional side views of an apparatus which may be used in a Dense Plasma Focus (DPF) electric discharge source, such as a source in FIG. 1.
Figure 2B:
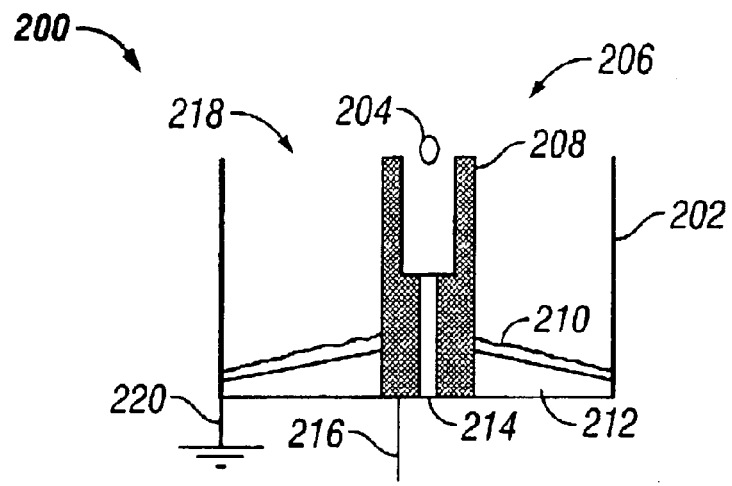

FIGS. 2A–2B are cross-sectional side views of an apparatus 200 which may be used in a Dense Plasma Focus (DPF) electric discharge source, such as the source 104 of FIG. 1. The apparatus 200 comprises a cylindrically symmetric anode 208, cathode 202 and insulator 212. The apparatus 200 may be used with a buffer gas 206, a source gas 214, a foil trap 230, a grazing incidence collector 232 and a pump 234.

The anode 208 may be coupled to a high voltage source 216. The cathode 202 may be grounded as shown by a ground symbol 220 in FIG. 2B.

Figure 4:
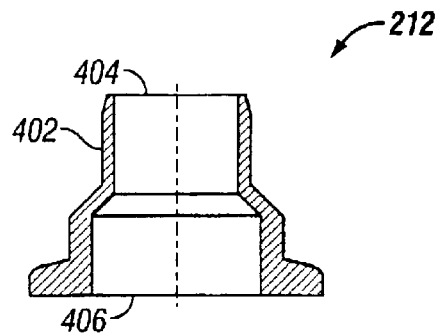
FIG. 4 is a cross-sectional side view of one embodiment of an insulator which may be slipped around the anode in FIGS. 2A–2B.

FIG. 4 is a cross-sectional side view of one embodiment of the insulator 212 which may be slipped around the anode 208 (center electrode) in FIG. 2A.

Figure 5:
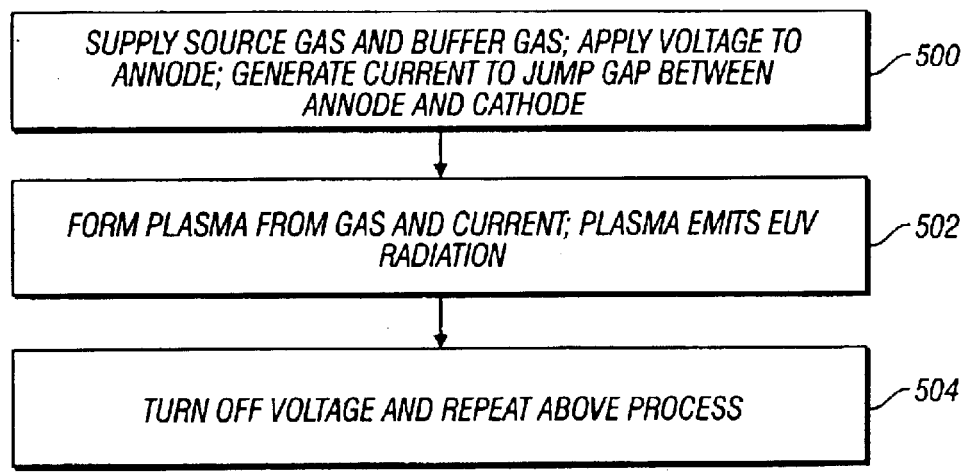
FIG. 5 illustrates a method of using the apparatus of FIGS. 2A–2B.

FIG. 5 illustrates a method of using the apparatus 200 of FIGS. 2A–2B. A source gas 214 (FIGS. 2A–2B), such as Xenon, is supplied through the anode 208, and a buffer gas 206, such as He, is supplied to a region 218 around the anode 208 at 500. A high positive voltage 216, such as 1 kV to 10 kV, is applied to the anode 208, i.e., across the anode 208 and the grounded cathode 202. The voltage causes a short pulse of very high current, such as about 50 kA, to jump the region or gap 218 between the electrodes 202, 208. The current causes electrons to flow through the region 218.

Figure 3:
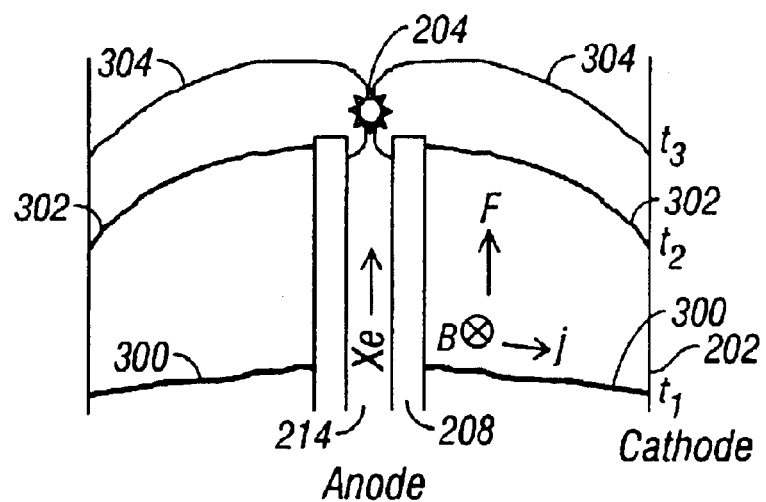
FIG. 3 illustrates a sheet of current at different points in time between an anode and a cathode in FIG. 2A.

FIG. 3 illustrates a sheet of current at different points in time between the anode 208 and cathode 202 in FIG. 2A. At a time t1, the current sheet starts at the bottom, as shown by lines 300, and produces an azimuthal B-field which causes a vertical j×B force. The current sheet moves up at t2 and t3, as shown by lines 302 and 304, and "pinches" around the top end of the anode 208.

The region 218 may be called a "pre-ionization region." A "pre-ionization" phase may involve creating an RF potential with pre-ionization pins 240A, 240B (FIG. 2A) located at the base of the cathode 202. The electron current in the pre-ionization region 218 weakly ionizes the gas atoms. This process creates an initial, pre-ionized, relatively cool plasma sheath 210 (containing both buffer gas (He) atoms and source gas (Xe) atoms) in the pre-ionization region 218 (FIG. 2B) at the base between the anode 208 and the cathode 202. This process may be referred to as pre-ionization of plasma.

The insulator 212 may help confine the electrons emerging from the pins 240A, 240B. The insulator 212 causes the current lines 300, 302, 304 in FIG. 3 to have a net angle, i.e., electrons travel slightly "upward" toward the anode 208 from the cathode 202. The ions (gas ionized by the current) in the plasma experience a reverse current. But the ions also experience a force due to the induced magnetic field of the electron currents, which causes the ions to move upward in FIG. 2B.

Ions smash together and create a hotter plasma "pinch" 204. This may occur at the top of the anode 208 at 502. The source gas molecules 214 may be atomically excited/ stimulated. The current "pinching" at the top of the anode 208 causes heating and densification of plasma (plasma formation) from Xenon coming up through the anode 208. The plasma pinch or plasma source 204 populates the excited atomic states of interest.

When the source gas molecules 214 de-excite, they may emit photons. The plasma source 204 emits photon radiation, including EUV radiation, above the anode 208. The EUV radiation may include wavelengths around 13 nm. Thus, current ionizes the source gas, which creates a discharge of photons at a wavelength of interest.

The voltage 216 is turned off from the anode 208 and then applied again at 504. The entire process (voltage applied to anode 208, then turned off) may last about 200 nanoseconds. The process may be repeated at rates of about 1–10 kHz to collect about 50–120 Watts of EUV.

The EUV source 200 described herein may sustain high volume manufacturing (HVM) lithography production. HVM implies a high repetition rate to sustain elevated radiation output in order to increase the overall wafer throughout of a lithography system.

During pulsed operation to form the EUV plasma source 204, there may be rapid cooling or dissipation of heat, which is transferred from the plasma when the plasma operation is shut down. For example, the apparatus 200 may dissipate 25 kW.

Some of the photons may have the proper/desired wavelength, but in general, very few do. Thus, it may be desirable to drive more current across the electrodes 202, 208 to generate more photons with the desired wavelength. Extremely high current densities may be desired to achieve the high fluxes demanded from EUV sources. High current densities lead to high heat loads and significant erosion rates of the electrode 208. At 10 kHz, erosion of the anode 208 due to heating and cooing may be severe.

The desired EUV photons and wasted power of all of the photons at undesired wavelengths may increase the temperature of the electrodes 202, 208. In addition, the electrodes 202, 208 may heat up as they are struck by high energy electrons, high energy ions and hot gas molecules.

Excessive heating followed by rapid cooling may expose the electrodes 202, 208 to extreme thermal stresses.

Electrode Characteristics

Thus, it may be desirable to provide the electrodes 202, 208 with a high thermal-shock resistance, to prevent damage during rapid cooling following pulsed operation of the apparatus 200. The material used to fabricate the electrodes 202, 208 should be able to withstand the heat load and heat dissipation without cracking, even when the hot-cold cycling reaches a high frequency.

It may also be desirable for the electrodes 202, 208 to be resistant to erosion from ion bombardment and radiation damage caused by extreme ultraviolet and longer wavelength photons. During the "rundown" and "pinch" phases of the pulsed plasma operation, the electrodes 202, 208 are bombarded by excessive amounts of photon, electron, and ion radiation. This bombardment may cause erosion into the plasma, which may have a deleterious effect on plasma formation, stability, and output power.

The debris emitted from the electrodes 202, 208 may cause damage to sensitive optical elements that are located nearby, such as the collector 232 in FIG. 2A and an illuminator, which follows the collector 232. Other optical elements along the optical path, such as the reticle 107 and "projection optics" (PO), may also be affected. The collector 232 and the illuminator have a high risk for particle debris contamination from the discharge source.

The debris may also negatively impact the stability and output of the radiation from the EUV source.

Currently, a commonly used electrode material is tungsten. Tungsten has good thermal conductivity but has sputtering yields between 0.6 and 1.3 atoms/(600 ev Ar ion). This leads to sputtering rates that generate unacceptably high amounts of debris. The electrodes 202, 208 may need to be frequently replaced. The debris also increases the load for debris mitigation devices that protect the delicate radiation collector optics, e.g., collector 232. Because of this short lifetime, the present solutions and materials (tungsten) are not capable of supporting cost-effective EUV sources that operate at HVM power levels.

As an example, the anode and/or cathode 208, 202 (hereinafter referred to as "electrodes") in the discharge produced plasma EUV source 200 may comprise specific types of pyrolitic graphite (PG). The electrodes 202, 208 may comprise substrate nucleated pyrolitic graphite (SN PG) or continuously nucleated pyrolitic graphite (CN PG), which are developed by the MINTEQ division of Minerals Tech Inc.

Pyrolitic graphite may address the electrode issues described above. An electrode material such as pyrolitic graphite may have good electrical conductivity. SN PG and CN PG have a resistivity of 500 micro ohms-cm in the "a-b" plane and 0.6 ohm-cm in the "c" direction (FIG. 7).

Figure 7:
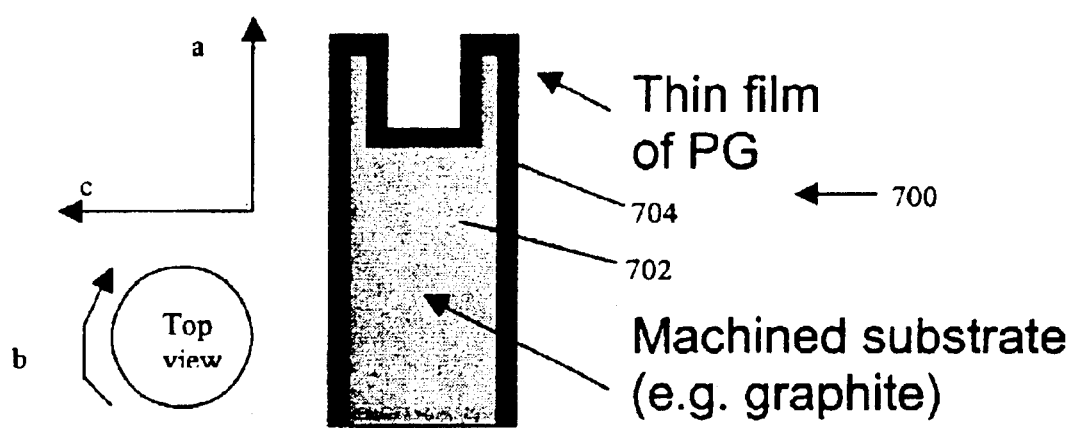
FIG. 7 illustrates an electrode made by the method of FIG. 6.

FIG. 7 illustrates an example of an electrode 700 that may be used in the source 200 of FIG. 2A. In FIG. 7, the "a" axis is the height of the cylinder 702. The "b" axis is the width of a coating layer 704, like a rolled paper towel. On the cylinder, the "b" axis is tangential to the diameter of the cylinder axis. For a CVD deposition process, the "a-b plane" in FIG. 7 corresponds to a single layer 704 of carbon (PG) atoms deposited around the cylinder substrate 702, like a paper towel wrapped around a center roll. As more monolayers are added, the PG layer/film starts to have thickness. The thickness direction is represented by the "c" axis and is directed radially outward from the cylinder axis.

An electrode material such as pyrolitic graphite may have good thermal conductivity to enable heat transferred from the plasma to rapidly dissipate. Good thermal conductivity allows heat to be carried away from the high heat regions of the electrodes 202, 208. The thermal conductivity of SN PG and CN PG is improved in the a-b plane. SN PG has a thermal conductivity of 3.45 Watts/centimeter*Kelvin in the a-b plane. CN PG has a thermal conductivity of 3.04 W/cm-K. Both values are about twice the thermal conductivity of tungsten. In the c direction, the thermal conductivities of both SN PG and CN PG are 0.02 W/cm-K.

An electrode material such as pyrolitic graphite may be resistant to ion bombardment and radiation damage caused by EUV and longer wavelength photons. Sputtering is reduced compared to tungsten, which allows parts to last longer and generate less debris. PG has a sputter yield (@

600 electron volts (eV) Argon) of 0.2 atoms/ion, which is three times better than tungsten. Argon is the standard for comparison when discussing sputtering rates.

Some details of Substrate Nucleated Pyrolitic Graphite may include:

Melting temperature>3650 degrees Centrigrade;

Thermal conductivity ~3.45 W/cm-K in the "a-b" plane, 0.02 W/cm-K in the "c" direction;

Thermal expansion ~0.6*10^-6 in the "a-b" plane, 6.8*10^-6 in the "c" direction;

Tensile strength ~8 Kg/mm^2;

Resistivity 500 micro ohm-cm;

Sputtering yield @ 600 eV Ar: 0.2 atoms/ion

Some details of Continuously Nucleated Pyrolitic Graphite may include:

Melting temperature>3650 degrees Centrigrade;

Thermal conductivity ~3.04 W/cm-K in the "a-b" plane, 0.02 W/cm-K in the "c" direction;

Thermal expansion ~0.6*10^-6 in the "a-b" plane, 6.8*10^-6 in the "c" direction;

Tensile strength ~8 Kg/mm^2;

Resistivity 500 micro ohm-cm;

Sputtering yield @ 600 eV Ar: 0.2 atoms/ion.

The asymmetry between the "a-b" plane behavior and the "c" axis behavior may impact design considerations when deciding how to handle the heat load incident on the electrode.

Method of Fabrication

An electrode material such as pyrolitic graphite may be formed in a desired electrode shape. Working electrodes 202, 208 may be formed from these graphite materials by using chemical vapor deposition (CVD) techniques to deposit thin coatings of pyrolitic graphite 704 on a suitable substrate material 702 machined into a desired electrode shape, as described below.

Figure 6:
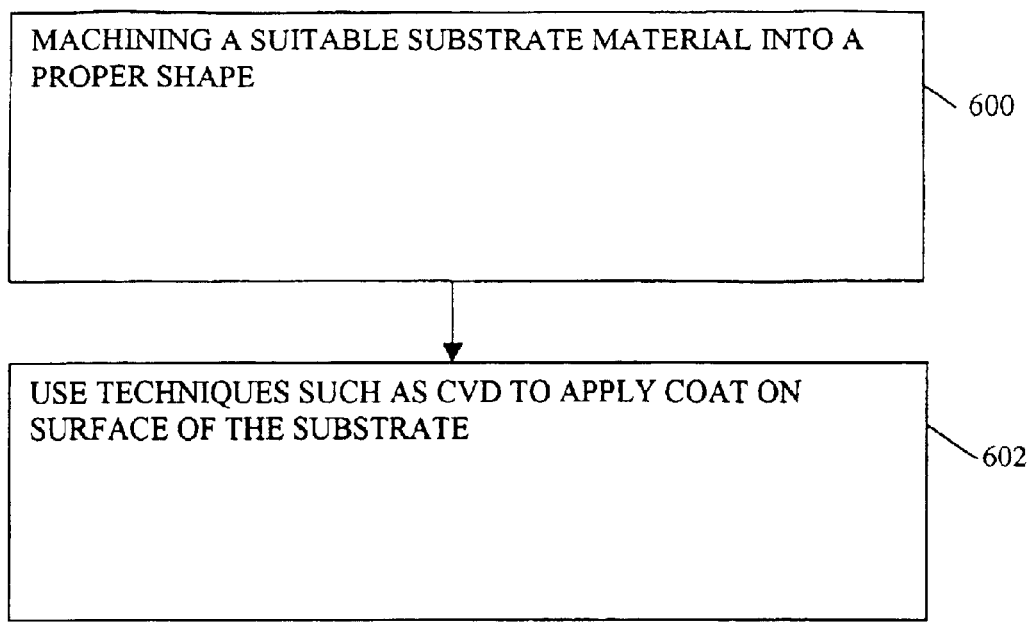
FIG. 6 illustrates a method of fabricating an electrode, which may be used in a source apparatus of FIG. 2A.

FIG. 6 illustrates a method of fabricating an electrode 202 or 208 that may be used in the source apparatus 200 of FIG. 2A. FIG. 7 illustrates an electrode 700 (e.g., anode shown) made by the method of FIG. 6. An electrode is created by first machining a suitable substrate material 702 into a proper pre-determined shape at 600.

A "suitable" substrate material may be selected to have a high melting point, such as greater than 2200 degrees C. and a coefficient of thermal expansion that is closely matched to that of pyrolitic graphite in the a-b plane (0.5 microns/m-C). Candidate materials for the substrate 702 include natural diamond or graphite. Tungsten, molybdenum, and ruthenium may be used if "adhesion layers" are applied to match the coefficient of thermal expansion (CTE) to that of the PG coating.

An adhesion layer may be formed between the substrate and the pyrolitic graphite (PG) layer. A variety of options may exist. If the substrate is solid graphite machined using some suitable milling technique, then adhesion is not a problem because PG to graphite bonds well. A couple of techniques exist for adhesion promotion in other cases. One is to deposit nitride as an adhesion layer, which bonds well to both metal and carbon. SiN and TaN are good examples. Another technique is to use a "seed" where graphite is "sprinkled" onto the surface of the substrate. The carbon agglomerates around the seeds to form the PG. The seed technique has been demonstrated in conjunction with hydrocarbon pre-cursors and hydrogen for various CVD processes (not specifically PG). Another method is to roughen the surface if it is very smooth to start. The surface after a diamond milling may probably be quite rough. The adhesion promotion may be modified depending upon the specific choice of substrate.

As an example, a block of tungsten may be machined, and a PG coating is deposited on the machined tungsten. As another example, a block of tungsten may be machined, and a diamond coating may be deposited on the machined tungsten. Then a PG coating is deposited on top of the diamond coating. Standard milling techniques can be used for graphite and any of the metallic substrates listed. Diamond milling is a typical and precise method.

CVD techniques may be used to coat the surface of the machined substrate 702 with either substrate nucleated (SN) or continuously nucleated (CN) pyrolitic graphite (PG) at 602. The coating 704 may be formed to approximately 1 mm thickness. The coating 704 may coat all electrode surfaces that will be exposed to the EUV plasma. This construction can be done by the MINTEQ division of Minerals Tech Inc., the company that developed SN PG and CN PG.

A number of embodiments have been described. Nevertheless, it will be understood that various modifications may be made without departing from the spirit and scope of the application. Accordingly, other embodiments are within the scope of the following claims.

What is claimed is:

1. An apparatus comprising:
an extreme ultraviolet radiation source comprising:
a first electrode configured to paws current across a region, the first electrode comprising at least one pyrolitic graphite layer disposed adjacent to an outer surface of a first electrode substrate.

2. The apparatus of claim 1, wherein the extreme ultraviolet radiation source further comprises a second electrode configured to receive current from the first electrode.

3. The apparatus of claim 2, wherein at least one of the first electrode and the second electrode comprises substrate nucleated pyrolitic graphite (SN PG).

4. The apparatus of claim 2, wherein at least one of the first electrode and the second electrode comprises continuously nucleated pyrolitic graphite (CN PG).

5. The apparatus of claim 1, wherein the at least one pyrolitic graphite layer disposed adjacent to an outer surface of a first electrode substrate comprises a first pyolitic graphite layer having a c axis oriented substantially perpendicular to the outer surface of the first electrode substrate.

6. The apparatus of claim 1, wherein the first electrode further comprises a diamond coating between the outer surface of the first electrode substrate and the at least one pyrolitic graphite layer.

7. The apparatus of claim 1, wherein the first electrode substrate comprises graphite.

8. The apparatus of claim 1, wherein the first electrode comprises the first electrode substrate, an adhesion layer and the at least one pyrolitic graphite layer, wherein the at least one pyrolitic graphite layer is adjacent to the adhesion layer.

9. The apparatus of claim 1, wherein the apparatus comprises a lithography system.

10. The apparatus of claim 1, further comprising a plurality of optics operable to interact with extreme ultraviolet radiation from the extreme ultraviolet source.

11. The apparatus of claim 1, further comprising a plurality of optics operable to reflect extreme ultraviolet radiation from the extreme ultraviolet source.

12. The apparatus of claim 1, wherein the extreme ultraviolet source is an electric discharge extreme ultraviolet source.

13. The apparatus of claim 1, wherein the extreme ultraviolet source is a dense plasma focus (DPF) electric discharge extreme ultraviolet source.

14. An electrode comprising:
   a substrate;
   a first layer on the substrate having a first thermal expansion coefficient;
   a second layer on the substrate, the second layer comprising a material having a thermal conductivity of about 3.0 to about 4.0 Watts/centimeter*Kelvin and a sputter yield of about 0.2 atoms/ion at 600 eV Ar, the second layer further having a second thermal expansion coefficient substantially matched to the first thermal expansion coefficient.

15. The electrode of claim 14, wherein the substrate comprises a refractory metal.

16. The electrode of claim 14, wherein the first layer is selected from the group consisting of graphite and diamond.

17. A method of making an electrode, the method comprising:
   forming a substrate to have a pre-determined shape, the substrate having an outer surface; and
   depositing pyrolitic graphite on a surface of the substrate so that the c axis of the pyrolitic graphite is generally perpendicular to the outer surface, wherein the substrate and the pyrolitic graphite are included in the electrode.

18. The method of claim 17, wherein the substrate comprises a refractory metal, the first layer comprises a plurality of graphite seeds, and the second layer comprises graphite.

19. The method of claim 17, wherein the substrate comprises graphite.

20. The method of claim 17, wherein the pyrolitic graphite comprises substrate nucleated pyrolitic graphite (SN PG).

21. The method of claim 17, wherein the pyrolitic graphite comprises continuously nucleated pyrolitic graphite (CN PG).

22. The method of claim 17, wherein said depositing comprises chemical vapor deposition.

23. The method of claim 17, wherein the pyrolitic graphite is deposited to a thickness of about 1 millimeter or greater.

24. The method of claim 17, further comprising forming an adhesion layer on the substrate.

* * * * *